United States Patent
Kieft et al.

(10) Patent No.: US 11,127,562 B1
(45) Date of Patent: Sep. 21, 2021

(54) SYSTEM AND METHOD FOR RF PULSED ELECTRON BEAM BASED STEM

(71) Applicant: FEI Company, Hillsboro, OR (US)

(72) Inventors: Erik Rene Kieft, Eindhoven (NL); Bert Henning Freitag, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/985,811

(22) Filed: Aug. 5, 2020

(51) Int. Cl.
  *H01J 37/26* (2006.01)
  *H01J 37/04* (2006.01)
  *H01J 37/28* (2006.01)

(52) U.S. Cl.
  CPC .......... *H01J 37/265* (2013.01); *H01J 37/045* (2013.01); *H01J 37/28* (2013.01)

(58) Field of Classification Search
  CPC .. H01J 37/00; H01J 37/02; H01J 37/28; H01J 37/265; H01J 37/045; H01J 37/023; H01J 37/063; H01J 37/073; H01J 37/147; H01J 37/1474; H01J 37/261

USPC .......................................... 250/306, 307, 311
  See application file for complete search history.

(56) References Cited

U.S. PATENT DOCUMENTS

| | | | | |
|---|---|---|---|---|
| 4,382,182 A | * | 5/1983 | Matsuzaka | H01J 37/28 250/307 |
| 2017/0243713 A1 | * | 8/2017 | Kieft | H01J 37/20 |
| 2018/0301317 A1 | * | 10/2018 | Luiten | H01J 37/063 |

* cited by examiner

*Primary Examiner* — Jason L McCormack (57) ABSTRACT

Disclosed herein are systems and methods for pulsing electron beams and synchronizing the pulsed electron beam with scanning a sample at a plurality of scan locations. An example method at least includes pulsing an electron beam to form a pulsed electron beam having a pulse period, moving the pulsed electron beam to interact with a sample at a plurality of locations, the interaction at each of the plurality of locations occurring for a dwell time, and synchronizing data acquisition of the interaction of the pulsed electron beam with the sample based on the pulsing and the translating of the electron beam, wherein the dwell time is based on a derivative of the pulse period.

20 Claims, 5 Drawing Sheets

Pulse an electron beam to form a pulsed electron beam having a pulse period

303

Move the pulsed electron beam to interact with a sample at a plurality of locations, the interaction at each of the plurality of locations occurring for a dwell time

305

Synchronize data acquisition of the interaction of the pulsed electron beam with the sample based on the pulsing and the translating of the electron beam, wherein the dwell time is based on a derivative of the pulse period

SYSTEM AND METHOD FOR RF PULSED ELECTRON BEAM BASED STEM

FIELD OF THE INVENTION

The invention relates generally to charged particle microscopy, and specifically to pulsed beam charged particle microscopy.

BACKGROUND OF THE INVENTION

Electron microscopy analysis of non-conducting samples is typically difficult due to the damage and imaging effects charge accumulation can cause. For example, sample movement due to charging and discharging events caused by the electron beam result in poor image quality. Additionally, soft material, such as biological materials, can be damaged due to the electron beam exposure, which can limit imaging and subsequent analysis. While attempts have been made to remedy such issues, the attempts to date have their own drawbacks. Such attempts include reduced overall electron dose, reduction of dose rate, and cryogenic electron microscopy. Reducing dose and/or dose rate can lead to noisy images and long acquisition time, whereas cryogenic electron microscopy adds multiple levels of complexity and cost. Even considering the known techniques, new techniques to image non-conducting materials is desired.

SUMMARY

Disclosed herein are systems and methods for pulsing electron beams and synchronizing the pulsed electron beam with scanning a sample at a plurality of scan locations. An example method at least includes pulsing, with a radio frequency cavity, an electron beam to form a pulsed electron beam having a pulse period, moving the pulsed electron beam to interact with a sample at a plurality of locations, the interaction at each of the plurality of locations occurring for a dwell time, and synchronizing data acquisition of the interaction of the pulsed electron beam with the sample based on the pulsing and the translating of the electron beam, wherein the dwell time is based on a derivative of the pulse period.

An example system for pulsing electron beams and synchronizing the pulsed electron beam with scanning a sample at a plurality of scan locations at least includes an electron emitter to provide an electron beam along an optical axis, an RF cavity including an aperture, the RF cavity arranged so that the optical axis extends through the aperture, deflectors coupled to deflect the electron beam, and a controller coupled to at least the RF cavity and the deflectors. The controller including or coupled to non-transitory machine readable media including code that, when executed by the controller, causes the controller to establish an RF wave in the RF cavity, the RF wave to produce a pulsed electron beam having a pulse period, move the pulsed electron beam using the deflectors, the moving pulsed electron beam interacting with a sample at each location of a plurality of locations for a dwell time, and synchronize data acquisition of the interaction of the pulsed electron beam with the sample based on the pulsing and the moving of the electron beam, wherein the dwell time is based on a derivative of the pulse period.

BRIEF DESCRIPTION OF THE DRAWINGS

Like reference numerals refer to corresponding parts throughout the several views of the drawings.

DETAILED DESCRIPTION OF EMBODIMENTS

Embodiments of the present invention are described below in the context of an electron microscope that produces a pulsed electron beam where sample scanning is synchronized to a pulse rate of the pulsed electron beam. In some embodiments, the electron microscope is a scanning transmission electron microscope. The scanning of the sample is synched to the pulse rate so that an equal number of pulses is applied to the sample at each scan location. However, it should be understood that the methods described herein are generally applicable to a wide range of different tomographic methods and apparatus, including both cone-beam and parallel beam systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

Analysis of non-conducting samples, including biological samples, using electron microscopes (EM), such as transmission electron microscopes (TEM), scanning TEMs (STEM), and the like can be hampered due to the sample material itself. For example, non-conducting samples in an EM environment will accumulate charge due to the impinging electron beam. Such charge build up, however, erodes the quality of acquired image due to sample drift because of charging and discharging events. Such charge build up also affects the path of the electron beam, which affects image quality. With regards to biological samples, not only is there charge build up issues, but the irradiation of the electron beam can also damage the sample. These issues all lead to poor images, which may result in poor image-based analysis.

As noted above, prior attempts to solve these issues have been made but those attempts result in other undesired issues. For example, limiting the overall dose delivery (dose being the amount of charge provided to the sample at a given location and/or in total) may reduce or eliminate charging and damage effects but may also result in poor image quality due to poor noise to signal ratio. Another example is the reduction in dose delivery, e.g., the rate at which the electron beam provides electrons to the sample, but such imaging strategy results in increased acquisition time. Such time increase is highly undesirable. With regards to the use of cryo-EM, the sample preparation and microscope are both greatly affected. First, the sample must be cryogenically cooled, which can be tricky for biological samples, and the microscope must include cryo-cooled stages, which complicates the microscope and increases costs. While cryo-EM can provide high quality images, such increase sample preparation and costs is undesirable in many use cases. As such, a new technique to address non-conducting and biological samples is desired.

One solution is to temporally structure the electron beam used to probe the samples. One technique to temporally structure the electron beam is to pulse the electron beam. Research has shown that temporally structured illumination can have a beneficial effect on reducing damage mechanisms, beyond simply reducing the dose rate and/or overall dose. For example, it has been shown that the charge/discharge instabilities in images (e.g., jumps in STEM images) can be avoided when illuminating non-conducting samples, including biological samples, with pulsed electron beams.

The pulsing of the electron beam can be achieved in various ways, such as using a radio frequency (RF) cavity, a photoelectron induced electron emitter, fast beam blanking, and combinations thereof. For the RF cavity, one or more RF waves established in the cavity will sweep a traversing electron beam across an output aperture to generate an electron pulse. When the electron beam is aligned with the aperture, the electron beam continues along the path, but ceases to exit the aperture when the RF wave sweeps it away from the aperture. This process of moving the electron beam with the RF wave or multiple RF waves can generate a pulse period of a desired frequency and duty cycle. The relationship between the frequency of the electron beam pulses and the frequency of the RF wave need not be one-to-one, but that is possible. For example, one electron beam pulse may be formed for one RF wave period. Alternatively, two electron beam pulses may be formed per one RF wave period. In an embodiment that simultaneously includes multiple RF waves in the cavity, two for example, a derivative of the RF frequencies present will produce the frequency of the electron beam pulses. In such an embodiment, the derivative may include a difference in frequencies or multiples of the frequencies. The pulsing of the beam, as noted, helps reduce damage and charging effects of the sample, which improves image quality due to reduction in dose.

To further improve image quality, the pulsing of the electron beam can be synchronized with the scanning of the sample. Such synchronization can result in an equal number of electron beam pulses being delivered to each scan location, e.g., pixel. For example, the dwell time, e.g., the time the electron beam is directed at each scan location, can be synched, e.g., set to, a desired number of pulse periods, such as an exact integer number of pulse periods. Such scan and image strategy can result in an equal dose distribution between each scan pixel, which influences the damage and charge/discharge effects on non-conducting samples, especially in STEM imaging.

Figure 1:
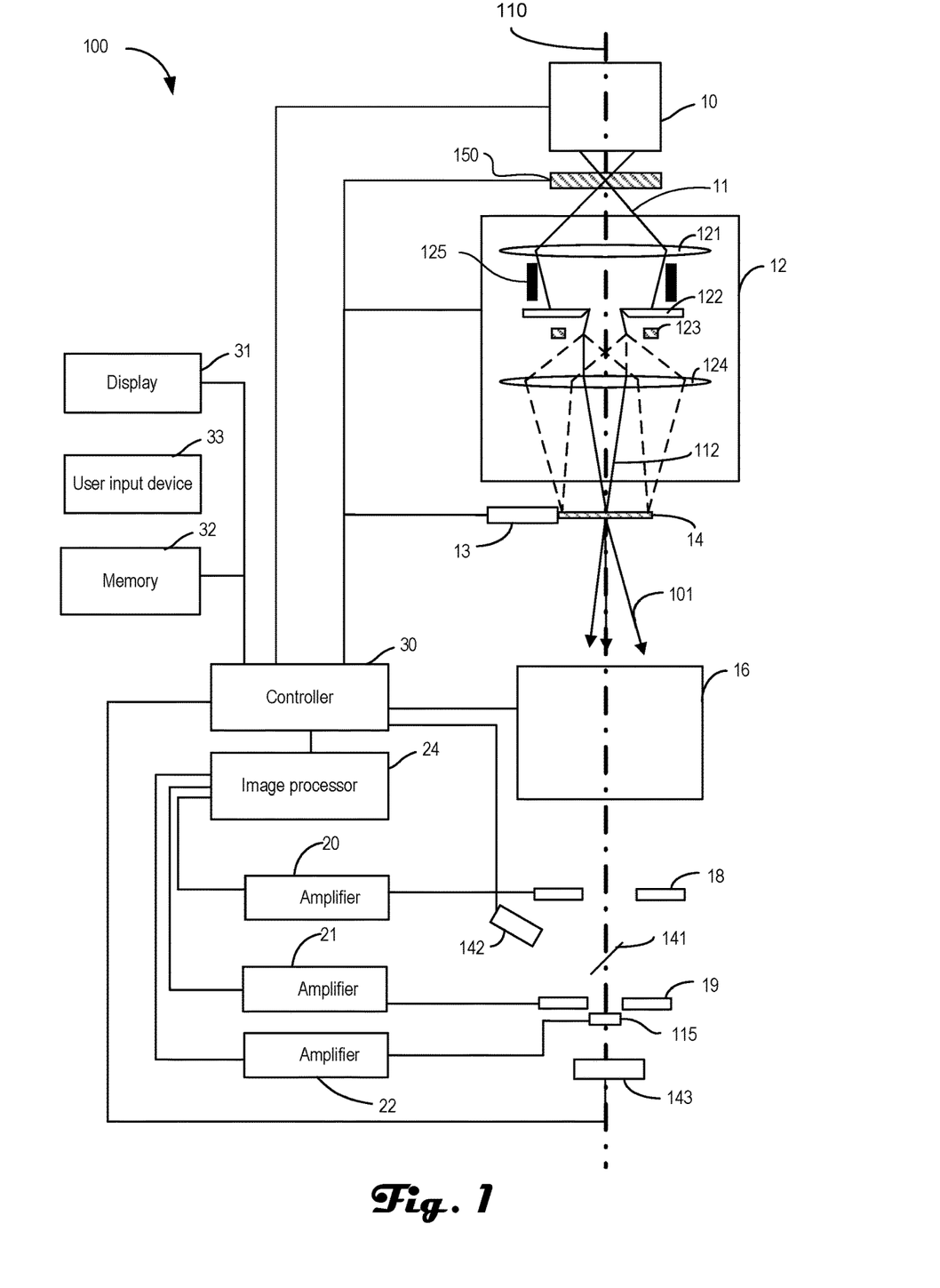
FIG. 1 is an STEM system in accordance with an embodiment of the disclosure.

FIG. 1 is an STEM system 100 in accordance with an embodiment of the disclosure. STEM system 100, system 100 for short, includes an electron source 10 that emits charged particles, such as electron beam 11, towards a focusing column 12. The electron beam may generate high energy electrons, that is, electrons having typical energies of between about 10 keV and 1,000 keV. In some embodiments, the focusing column 12 may include one or more of a condenser lens 121, aperture 122, scan coils 123, and upper objective lens 124. The focusing column 12 focuses electrons from electron source 10 into a small spot on sample 14. Different locations of the sample may be scanned by adjusting the electron beam direction via the scan coils 123, which may also be referred to as deflectors. For example, by operating scan coils 123, incident beam 112 may be shifted or scanned (as shown with dashed lines) to focus on different locations of sample 14. System 100 additionally includes beam blankers 125 arranged within the focusing column 12. The beam blankers 125 may be arranged before aperture 122. The beam blankers 125 may be controlled by controller 30 to deflect the (pulsed) electron beam away from the optical path and onto a surface of the aperture 122 outside of optical axis 110. In some embodiments, the beam blankers 125 can be operated at frequencies of 100 of kHz to 1 GHz. Of course, other operating frequencies are available as well.

Primary axis 110 of the imaging system may be the central axis of the electron beam emitted from the electron source 10. Primary axis 110 may also be the central axis of the condenser lens 121. When the incident beam is not shifted or scanned (that is, incident beam 112), the incident beam may be focused at the location where the primary axis 110 intersects the sample 14.

System 100 further includes an RF cavity 150 arranged at a crossover plane of system 100. In the embodiment shown in FIG. 1, RF cavity 150 is located at a first crossover plane post electron source 10. The arrangement shown, however, is not limiting and the RF cavity 150 may be located at any crossover pane of system 100 between electron source 10 and sample 14. RF cavity 150 may be energized with one or more RF waves to generate a pulsed electron beam from a continuous electron beam. For example, continuous electron beam 11 entering RF cavity 150 may exit the cavity as a pulsed electron beam with a pulse width and pulse frequency determined by one or more RF waves formed in the cavity. The RF cavity 150 includes an aperture on both the top and bottom for entrance and exit of the electron beam 11. To form the electron pulses, the RF wave(s) inside the RF cavity 150 sweep the electron beam 11 across the exit aperture.

The RF cavity 150 may be coupled to a controller, such as controller 30, or an RF-specific controller (not shown). The controller may establish the one or more RF waves within the cavity at a desired frequency. Example frequencies are in the range of 1 GHz to 10 GHz, for example, but frequencies outside of that range are also possible. A desired operating frequency may be determined based on a desired pulse width and/or pulse period. In some embodiments, two RF waves oriented perpendicular to each other for example, may be established together for forming the electron beam pulses. When not in use, the RF cavity 150 may be de-energized so that electron beam 11 passes without incident and no pulses are formed. In such instances, system 100 may probe sample 14 with a continuous electron beam 11, for example.

The sample 14 may be held by a sample holder 13. The sample holder 13 may adjust sample orientation by tilting and/or translating the sample. As an example, a coordination system may be defined for adjusting the sample orientation so that the incident beam 112 may be focused on sample 14 along the primary axis 110 of the imaging system. A z-axis of the coordinate system may be parallel to the primary axis 110, and an x-y plane may be a plane perpendicular to the z-axis. The sample 14 may be tilted relative to the primary axis 110 by rotating around the x-axis or around the y-axis. The sample holder may also translate or shift the sample 14 along any of the x-axis, y-axis, and z-axis. In some embodiments, the sample 14 may be rotated around the z-axis.

Electrons 101 exiting the sample 14 due to incident beam 112 may enter projector 16. In one embodiment, the projector 16 may be a separate part from the focusing column. In another embodiment, the projector 16 may be an extension of the lens field from a lens in focusing column 12.

The projector 16 may be adjusted by the controller 30 so that direct electrons passed through the sample impinge on disk-shaped bright field detector 115, while diffracted or scattered electrons, which were more strongly deflected by sample 14, are detected by one or more of a high-angle annular dark-field (HAADF) detector 18 and/or an annular dark-field (ADF) detector 19. Signals from the HAADF and ADF detectors may be amplified by amplifier 20 and amplifier 21, respectively, while signals from bright field detector 115 may be amplified by amplifier 22. Signals from the amplifiers 20, 21, and 22 may be sent to image processor 24, which can form an image of sample 14 from the detected electrons. Each of the HAADF detector 18, ADF detector 19, and brightfield detector 115 may be a scintillator-photomultiplier detector, a solid-state PIN detector, or a metal plate. The STEM system 100 may simultaneously detect signals from one or more of the ADF detector, the ADF detector, and the HAADF detector.

The controller 30 may control the operation of the imaging system 100, either manually in response to operator instructions or automatically in accordance with computer readable instructions stored in non-transitory memory 32. The controller 30 can be configured to execute the computer readable instructions and control various components of the imaging system 100 in order to implement any of the methods described herein. For example, the controller may adjust the beam location on the sample by operating the scan coils 123. The controller may adjust the profile of the incident beam by adjusting one or more apertures and/or lens in the focusing column 12. The controller may adjust the sample orientation relative to the incident beam by tilting the sample holder 13. The controller may shift the sample relative to the incident beam by translating the sample holder 13. The controller 30 may establish RF waves within RF cavity 150 and control beam blankers 125, Further, the controller 30 may synchronize the scanning of the pulsed electron beam, such as a dwell time at each scan location, with the frequency of the pulsed electron beam 112 so that a same or similar number of pulses are directed toward each scan location. The controller 30 may further be coupled to a display 31 to display notifications and/or images of the sample. The controller 30 may receive user inputs from user input device 33. The user input device 33 may include keyboard, mouse, or touchscreen.

In operation, system 100 emits electron beam 11 toward sample 14 via RF cavity 150 and focusing column 12. To image sample 14, scan coils 123 move the pulsed electron beam to different locations, also referred to as pixels, on the surface of sample 14, which provides images of each pixel location. At each location, the pulsed electron beam 11 may remain for a dwell time. For some sample types, as discussed above, the electron beam may be damaging, so limiting the exposure time, e.g., dose, is desirable. For such a sample, the scan coils 123 may be synchronized with the RF control signals so that a desired number of pulses are provided at each location. In some embodiments, the same number of pulses are provided at each location so that the dose at each location is equal. In some embodiments, the dwell time may be based on a desired integer number of electron beam pulses. In some embodiments, beam blankers 135 may be used to form the pulsed electron beam 12 at frequencies lower than the RF cavity 150. The use of the beam blankers 125 extends the overall frequency range of pulsed electron beam 12. Additionally, control of the scan coils 123 may be based on the RF control signals, which form the desired pulse period, so that the scan coils move the electron beam to each location so that a phase of the pulses, e.g., delay from start of the dwell time to first arriving electron pulse, is such that no pulses are accidentally missed and therefore ensuring that each location receives the same number of pulses. The image data from each location may then be combined to form STEM images of sample 14, for example.

Though a STEM system is described by way of example, it should be understood that the disclosed techniques may be used for forming electron beam pulses in any type of charged particle column. The present discussion of STEM imaging is provided merely as an example of one suitable imaging modality.

Figure 2:
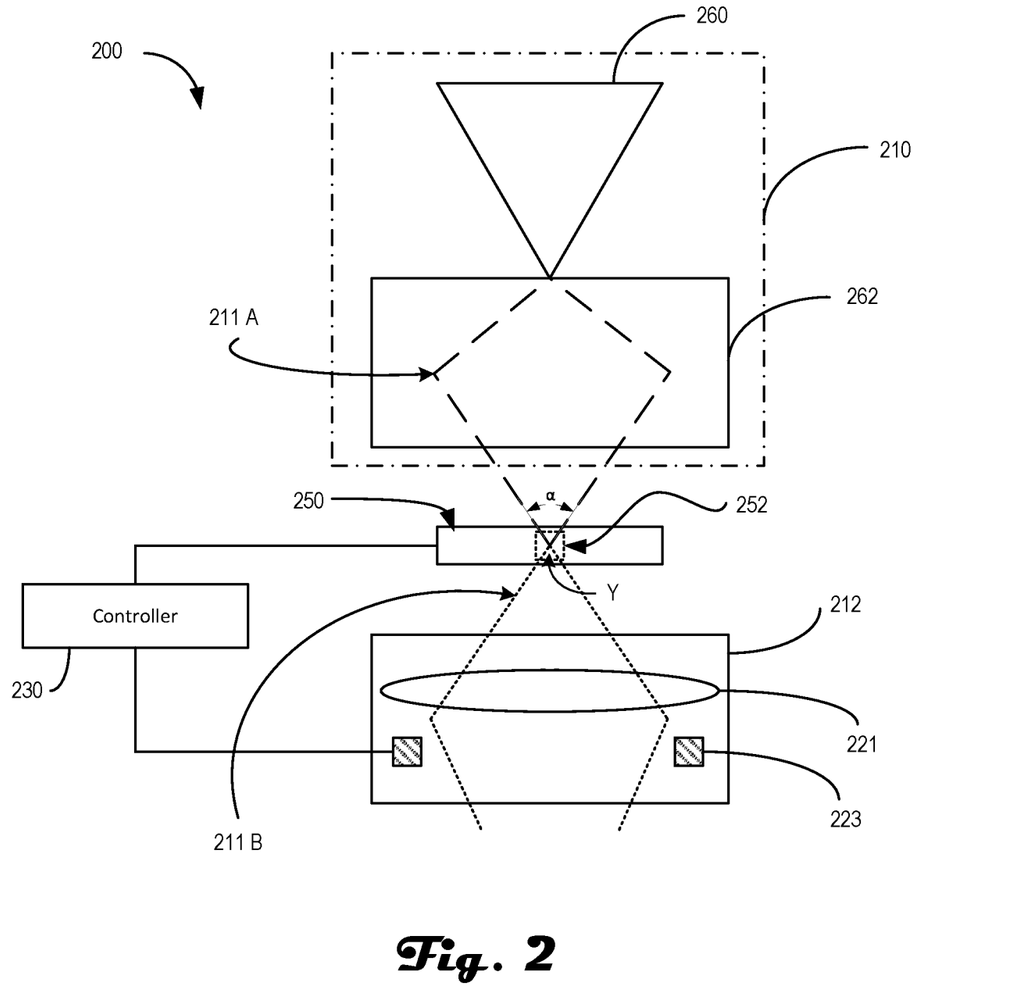
FIG. 2 is an example illustration of part of an electron microscope in accordance with an embodiment of the present disclosure.

FIG. 2 is an example illustration of part of an electron microscope 200 in accordance with an embodiment of the present disclosure. Electron microscope (EM) 200 may be a part of STEM system 100, for example, or it may be part of any type of electron-based microscope. Regardless of embodiment, EM 200 at least includes an electron source 210, an RF cavity 250, a focusing component 212, and a controller 230. EM 200 does not show an aperture plate or beam blankers such as aperture 122 and beam blankers 125, but such components can also be included. The EM 200 is configured to generate a pulsed electron beam from a continuous electron beam and direct the pulsed electron beam to a sample, for example.

The electron source 210 may at least include an electron emitter 260 and a gun lens 262. The electron emitter 260 may be any type of emitter known now or developed in the future, such as Schottky, field emission, cold field emission, thermal, etc. The emitter 210 may generate electron beam 211A that is collected by gun lens 262. Gun lens 262 may have one or more optical components coupled to receive electron beam 211 A and condition it for delivery toward focusing component 212. The gun lens 262 may be energized to focus electron beam 211 A at a plane between the gun lens 262 and the focusing component 212. Such plane, which may be referred to as a crossover plane, and is indicated by the location where the electron beam 211 A comes to a point, point Y. With regards to FIG. 2, the point Y where electron beam 211 A crossover itself coincides with RF cavity 250.

Conventionally, electron microscopes may have multiple crossover points along the column, depending on how the electron optics are arranged and energized, and the electron beam may approach each crossover plane at different angles, which are known as convergence angles. For example, electron beam 211 A has a convergence angle α as it approaches point Y. The angle α, as noted, can change and in subsequent crossover planes may be larger than that of the first crossover plane. While any of the crossover planes between the source 210 and the sample may be used for locating the RF cavity 250, locating the RF cavity 250 at the initial crossover point Y may ease implementation since the angle is relatively small. Such relatively small angles may ease design requirements for the RF cavity 250 to ensure that all of the electron beam is sufficiently swept over and output aperture, such as aperture 252.

The RF cavity 250 may include an aperture 252 that extends completely through the cavity. The aperture 252 allows the electron beam 211 A to pass through and be manipulated by one or more RF waves established within the RF cavity 250. The RF cavity 250 may include one or more antennae coupled to the controller 230 for establishing the one or more RF waves desired to produce a pulsed electron beam. The one or more RF waves may sweep electron beam 211 A over the aperture 252 to form the pulsed electron beam 211 B. For example, when the electron beam 211 A is passing through the aperture 252, the electron beam continues propagating along the EM 200 optical axis. However, as the RF wave moves the electron beam 211 A away from the aperture 252, then the electron beam 211 A does not continue to propagate along the optical axis. By moving the electron beam 211 A over the aperture 252 at a desired frequency, pulsed electron beam 211 B is formed. The frequency of the RF wave will determine the pulse period of the pulsed electron beam 211 B. For example, one electron pulse may be produced by one RF wave period, which would produce a one-to-one frequency conversion. Alternatively, two electron pulses may be produced by one RF wave period, which would double the frequency of the pulsed electron beam from the frequency of the RF wave. In some embodiments, two or more RF waves may be established, and their respective frequencies can produce a pulsed electron beam 211 B of different pulse periods and duty cycles. In such an embodiment, the frequency of the pulsed electron beam 211 B would be a derivative, e.g., difference between or multiple thereof, the frequencies of the two or more RF waves.

Focusing component 212 may at least include a condenser lens 221 and scan coils 223. The condenser lens 221 is an electrostatic lens, ab electromagnetic lens or a combination thereof. The lens 221 is arranged to receive pulsed electron beam 211 B after exiting RF cavity 250 and condition pulsed electron beam 211 B. The conditioning of the electron beam 211 B may include collimation, focusing, stigmation correction or combinations thereof, for example. Of course, other changes may also be made to the pulsed electron beam 211 B.

Scan coils 223 may be electrostatic or electromagnetic coils coupled to the controller 230. By charging the scan coils 223 is a desired patter, the trajectory of pulsed electron beam 211 B can be manipulated so that it impinges on a sample, such as sample 14, at a desired location. Additionally, delaying subsequent control signals to scan coils 223 may set a desired dwell time. As such, the scan coils control where the pulsed electron beam 211 B interacts with a sample and for how long. Further, the sequence of locations the pulsed electron beam 211 B interacts with the sample may also be controller. For example, the pulsed electron beam 211 B may be rastered across the sample, e.g., in a serpentine pattern, or it may be directed to a number of different and random locations on the sample.

In operation, controller 230 controls the one or more RF waves established in RF cavity 250 as well as controlling the scan coils 223. While the control of the scan coils 223 and RF cavity 250 may be performed separately, basing the control of the scan coils 223 on the RF cavity 250 control may ensure that an equal number of pulses are provided to each scan location on a sample. For example, controller 230 establishes the RF wave(s) in RF cavity 250, which will determine the pulse period and timing. Then, using such information, the scan coils 223 may move the pulsed electron beam 211 B from one location to the next so that a desired number of pulses are provided to each scan location.

Figure 3:
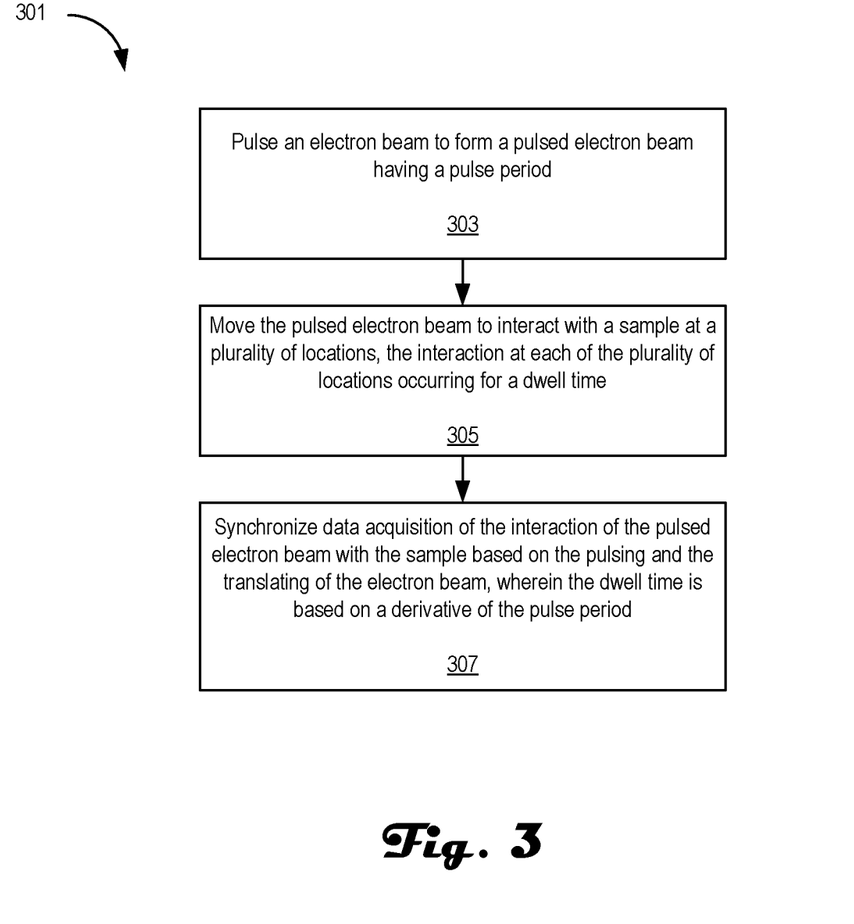
FIG. 3 is an example method in accordance with an embodiment of the present disclosure.

FIG. 3 is an example method 301 in accordance with an embodiment of the present disclosure. The method 301 outlines a process of synchronizing pulsed electron beam exposure of locations on a sample so that each location receives the same or similar number of pulses. Method 300 may be performed in an electron microscope, such as STEM system 100 or EM 200 for example.

Method 301 begins at process block 303, which includes pulsing an electron beam to form a pulsed electron beam. Forming the electron beam pulses may be performed using an RF cavity, for example, such as the RF cavity 150 or 250. In such an embodiment, as described above with regards to FIGS. 1 and 2, the RF cavity may be located at a crossover plane of an electron microscope. The first crossover plane after the electron source, for example. It should be noted, however, that any known techniques to provide pulsed electron beams will also work and are contemplated herein. For example, the pulsed electron beam may be generated using photoelectron sources that receive pulsed optical energy to generate the pulsed electron beam. Alternatively, beam blankers may be used to generate a pulsed electron beam from a continuous electron beam. Additionally or alternatively, a combination of techniques may used to obtain pulses of a desired width and/or period. Further, the desired frequency of the pulses may inform a best pulse generation technique. For example, if pulses in the range from 100 KHz to 1 GHz may be generated using beam blankers, whereas pulses above 1 GHz may be generated using an RF cavity or a photoelectron source. Clearly, by utilizing multiple pulse generation techniques a wide range of frequencies may be obtained.

Process block 303 may be followed by process block 305, which includes moving the pulsed electron beam to interact with a sample at a plurality of locations. At each location, the pulsed electron beam will remain for a dwell time. The dwell time determines an amount of electron dose the sample receives at each location as well as a number of electron pulses. The plurality of locations may be targeted in any order, such as randomly, in a designated order, or sequentially using a raster pattern.

Process block 305 may be followed by process block 307, which includes synchronizing data acquisition of the interaction of the pulsed electron beam with the sample based on the pulsing and the translating of the electron beam, wherein the dwell time is based on a derivative of the pulse period. The synchronization may ensure that each location receives the same or similar number of electron pulses, for example. In embodiments that provide a small number of pulses, e.g., 10 or less, to each scan location, it is desirable that the same number of pulses are delivered to ensure the dose at each location is roughly equal. On the other hand, if a larger number of pulses are provided to each scan location, e.g., greater than 10, then the number of pulses provided to each scan location need not be exact since the incremental charge will not be detrimental.

Figure 4:
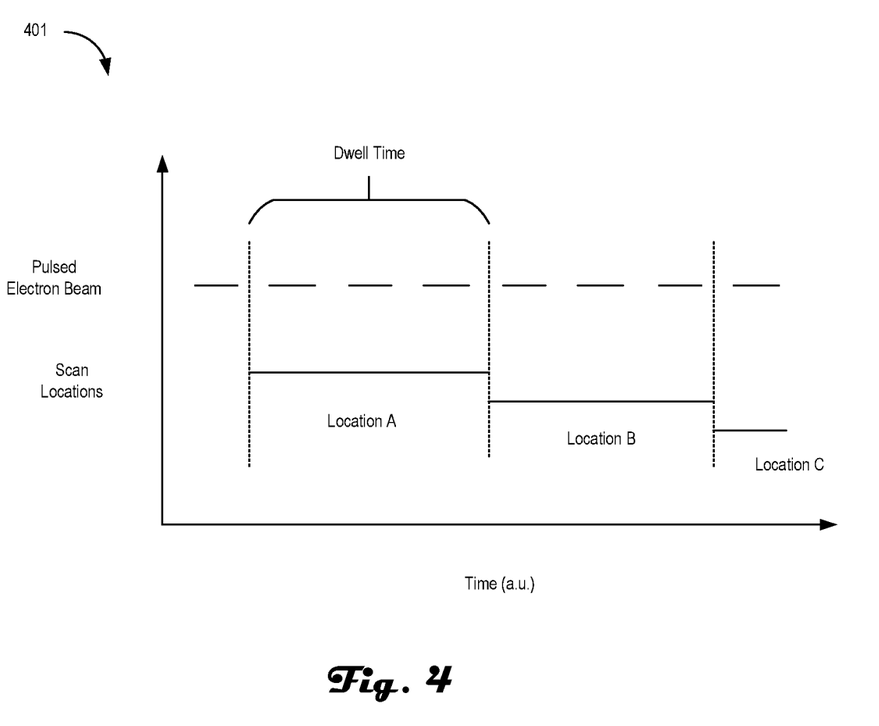
FIG. 4 is an graphic illustration of the relation of the pulse periods and the dwell times at a number of sample locations.

FIG. 4 is an graphic illustration 401 of the relation of the pulse periods and the dwell times at a number of sample locations. Graphic illustration 401 includes units of time along the bottom axis and shows a pulsed electron beam and three scan locations—A, B and C. As shown in the graphic, each scan location receives three electron beam pulses. Between pulses, the scan location is moved to a subsequent location. While only three pulses are shown to be received at each location, such number is only for illustration and any number of pulses can be delivered at each scan location. For example, each scan location can receive a single digit number of pulses, tens of pulses, hundreds of pulses, thousands of pulses, and so on. In general, the number of pulses will be a product of the pulse rate and the dwell time. Further, it is desirable, as noted, that each scan location receive the same or similar number of pulses.

Figure 5:
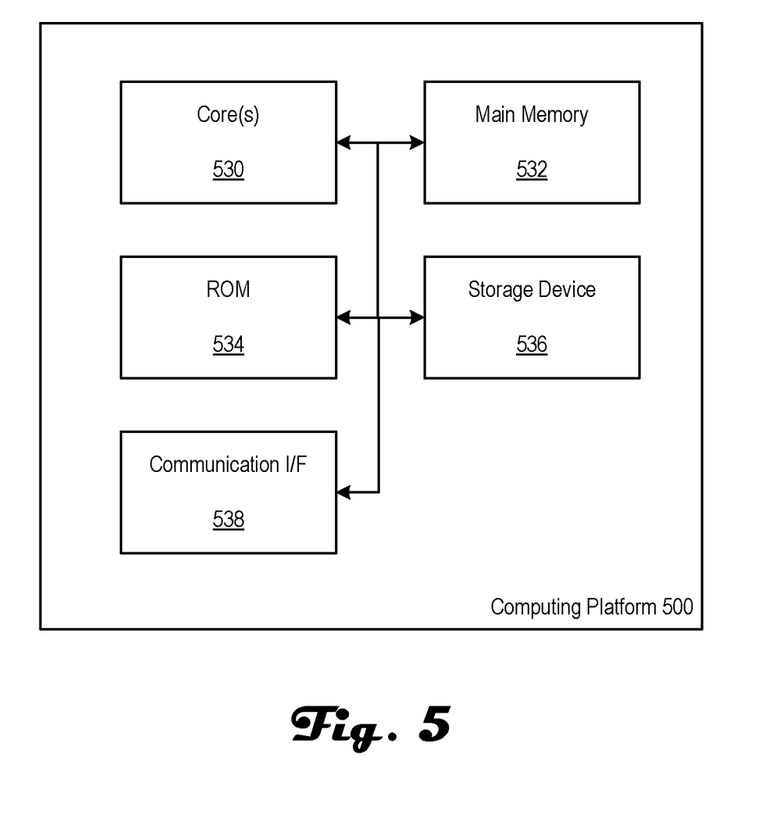
FIG. 5 is an example functional block diagram in accordance with an embodiment of the present disclosure.

FIG. 5 is an example functional block diagram 500 in accordance with an embodiment of the present disclosure. FIG. 5 is a block diagram that illustrates a computer system 500 that can be used to implement an embodiment of the present disclosure. The computing system 500 may be an example of computing hardware included with system 100 and/or EM 200, such controller 30/230, and which may incorporate memory 32 and be coupled to display 31 and user input device 33, for example. Computer system 500 at least includes a hardware processor, such as core(s) 530 for processing information, which may be coupled to a communication bus. The computing system 500 may be used to implement the methods and techniques disclosed herein, such as method 301, and may also be used to obtain images based on the synchronization of the scanning of the sample with the pulse period of a pulsed electron beam.

Computer system 500 also includes a main memory 532, such as a random access memory (RAM) or other dynamic storage device, coupled to a bus for storing information and instructions to be executed by core(s) 530. Main memory 532 also may be used for storing temporary variables or other intermediate information during execution of instructions to be executed by core 530. Such instructions, when stored in non-transitory storage media accessible to core 530, render computer system 500 into a special-purpose machine that is customized to perform the operations specified in the instructions. Main memory 532 may be memory 32 or separate from memory 32.

Computer system 500 further includes a read only memory (ROM) 534 or other static storage device coupled to the bus for storing static information and instructions for core 530. A storage device 536, such as a magnetic disk or optical disk, is provided and coupled to the bus for storing information and instructions.

Computer system 500 may be coupled via the bus to a display, such as display 31, for displaying information to a computer user. An input device 33, including alphanumeric and other keys, is coupled to the bus for communicating information and command selections to core 530. Another type of user input device is cursor control, such as a mouse, a trackball, or cursor direction keys for communicating direction information and command selections to core 530 and for controlling cursor movement on the display. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to core(s) 530 executing one or more sequences of one or more instructions contained in main memory 532. Such instructions may be read into main memory 532 from another storage medium, such as storage device 536. Execution of the sequences of instructions contained in main memory 532 causes core 530 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 536. Volatile media includes dynamic memory, such as main memory 532. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 640. Transmission media can also take the form of acoustic or light waves, such as those generated during radio-wave and infra-red data communications.

Various forms of media may be involved in carrying one or more sequences of one or more instructions to core 530 for execution. For example, the instructions may initially be carried on a magnetic disk or solid state drive of a remote computer. The remote computer can load the instructions into its dynamic memory and send the instructions over a network.

Computer system 500 also includes a communication interface 538 coupled to the bus. Communication interface 538 provides a two-way data communication coupling to a network link (not shown) that is connected to a local network. For example, communication interface 538 may be an integrated services digital network (ISDN) card, cable modem, satellite modem, or a modem to provide a data communication connection to a corresponding type of telephone line. As another example, communication interface 538 may be a local area network (LAN) card to provide a data communication connection to a compatible LAN. Wireless links may also be implemented. In any such implementation, communication interface 538 sends and receives electrical, electromagnetic or optical signals that carry digital data streams representing various types of information.

Computer system 500 can send messages and receive data, including program code, through network(s), a network link and communication interface 538. In the Internet example, a server might transmit a requested code for an application program through the Internet 666 via an ISP, local network and/or communication interface 538.

The received code may be executed by core 530 as it is received, and/or stored in storage device 536, or other non-volatile storage for later execution.

The embodiments discussed herein to illustrate the disclosed techniques should not be considered limiting and only provide examples of implementation. Those skilled in the art will understand the other myriad ways of how the disclosed techniques may be implemented, which are contemplated herein and are within the bounds of the disclosure.

An example method for generating a pulsed electron beam and synchronizing data acquisition based on the pulse period of the pulsed electron beam includes pulsing, with an RF wave, an electron beam to form a pulsed electron beam having a pulse period, moving the pulsed electron beam to interact with a sample at a plurality of locations, the interaction at each of the plurality of locations occurring for a dwell time, and synchronizing data acquisition of the interaction of the pulsed electron beam with the sample based on the pulsing and the translating of the electron beam, wherein the dwell time is based on a derivative of the pulse period.

The example method where synchronizing data acquisition of the electron beam with the sample based on the pulsing and the translating includes providing an equal number of electron beam pulses at each location of the plurality of locations.

The example method as above where the dwell time equals an integer number of pulse periods.

The example method as above where the derivative of the pulse period includes a plurality of pulse periods.

The example method above where the synchronization of the data acquisition is based on control signals from RF electronics, the RF electronics controlling the RF wave.

The example method above where an RF cavity controlled by the RF electronics forms the RF wave.

The example method above where the RF wave is formed at a crossover plane in a transmission electron microscope (TEM).

The example method above where the crossover plane is formed between a gun lens and a condenser system of the TEM.

The example method above where the crossover is formed by the gun lens.

The example method above where the TEM is operating in a scanning mode.

The example method above where the pulsed electron beam is pulsed in a range from 50 MHz to 10 GHz.

In an alternative embodiment of the above example method, beam blankers are used instead of or in addition to the RF wave to generate the pulsed electron beam.

An example system for generating a pulsed electron beam and synchronizing data acquisition based on the pulse period of the pulsed electron beam includes an electron emitter to provide an electron beam along an optical axis, a radio frequency (RF) cavity including an aperture, the RF cavity arranged so that the optical axis extends through the aperture, deflectors coupled to deflect the electron beam, and a controller coupled to at least the RF cavity and the deflectors. The controller including or coupled to non-transitory machine readable media including code that, when executed by the controller, causes the controller to establish an RF wave in the RF cavity, the RF wave to produce a pulsed electron beam having a pulse period, move the pulsed electron beam using the deflectors, the moving pulsed electron beam interacting with a sample at each location of a plurality of locations for a dwell time, and synchronize data acquisition of the interaction of the pulsed electron beam with the sample based on the pulsing and the moving of the electron beam, wherein the dwell time is based on a derivative of the pulse period.

The example system as above where the code to synchronize data acquisition of the interaction of the pulsed electron beam with the sample further includes code that, when executed by the controller, causes the controller to provide an equal number of electron beam pulses at each location of the plurality of locations.

The example system as above where the derivative of the pulse period includes a plurality of pulse periods.

The example system as above where the RF wave is formed at a crossover plane in a transmission electron microscope (TEM).

The example system as above where a crossover of the electron beam, formed at the crossover plane, is formed by a gun lens of the TEM.

The example system as above where the TEM is operating in a scanning mode.

The example system as above where the code to establish an RF wave further includes code that, when executed by the controller, causes the controller to establish two RF waves in the RF cavity.

The example system as above where the pulsed electron beam is pulsed in a range from 50 MHz to 10 GHz.

The example system as above further including a bright field detector, an annular dark field detector and a high angle annular dark field detector.

In an alternative embodiment of the above example system, beam blankers are used instead of or in addition to the RF wave to generate the pulsed electron beam.

What is claimed is:

1. A method comprising:
   pulsing, with an RF wave, an electron beam to form a pulsed electron beam having a pulse period;
   moving the pulsed electron beam to interact with a sample at a plurality of locations, the interaction at each of the plurality of locations occurring for a dwell time; and
   synchronizing data acquisition of the interaction of the pulsed electron beam with the sample based on the pulsing and the translating of the electron beam, wherein the dwell time is based on a derivative of the pulse period.

2. The method of claim 1, wherein synchronizing data acquisition of the electron beam with the sample based on the pulsing and the translating includes providing an equal number of electron beam pulses at each location of the plurality of locations.

3. The method of claim 1, wherein the dwell time equals an integer number of pulse periods.

4. The method of claim 1, wherein the derivative of the pulse period includes a plurality of pulse periods.

5. The method of claim 1, wherein the synchronization of the data acquisition is based on control signals from RF electronics, the RF electronics controlling the RF wave.

6. The method of claim 5, wherein an RF cavity controlled by the RF electronics forms the RF wave.

7. The method of claim 5, wherein the RF wave is formed at a crossover plane in a transmission electron microscope (TEM).

8. The method of claim 7, wherein the crossover plane is formed between a gun lens and a condenser system of the TEM.

9. The method of claim 8, wherein the crossover is formed by the gun lens.

10. The method of claim 7, wherein the TEM is operating in a scanning mode.

11. The method of claim 1, wherein the pulsed electron beam is pulsed in a range from 50 MHz to 10 GHz.

12. An apparatus comprising:
- an electron emitter to provide an electron beam along an optical axis;
- a radio frequency (RF) cavity including an aperture, the RF cavity arranged so that the optical axis extends through the aperture;
- deflectors coupled to deflect the electron beam; and
- a controller coupled to at least the RF cavity and the deflectors, the controller including or coupled to non-transitory machine readable media including code that, when executed by the controller, causes the controller to:
  - establish an RF wave in the RF cavity, the RF wave to produce a pulsed electron beam having a pulse period;
  - move the pulsed electron beam using the deflectors, the moving pulsed electron beam interacting with a sample at each location of a plurality of locations for a dwell time; and
  - synchronize data acquisition of the interaction of the pulsed electron beam with the sample based on the pulsing and the moving of the electron beam, wherein the dwell time is based on a derivative of the pulse period.

13. The apparatus of claim 12, wherein the code to synchronize data acquisition of the interaction of the pulsed electron beam with the sample further includes code that, when executed by the controller, causes the controller to provide an equal number of electron beam pulses at each location of the plurality of locations.

14. The apparatus of claim 12, wherein the derivative of the pulse period includes a plurality of pulse periods.

15. The apparatus of claim 12, wherein the RF wave is formed at a crossover plane in a transmission electron microscope (TEM).

16. The apparatus of claim 15, wherein a crossover of the electron beam, formed at the crossover plane, is formed by a gun lens of the TEM.

17. The apparatus of claim 15, wherein the TEM is operating in a scanning mode.

18. The apparatus of claim 12, wherein the code to establish an RF wave further includes code that, when executed by the controller, causes the controller to establish two RF waves in the RF cavity.

19. The apparatus of claim 12, wherein the pulsed electron beam is pulsed in a range from 50 MHz to 10 GHz.

20. The apparatus of claim 12, further including a bright field detector, an annular dark field detector and a high angle annular dark field detector.

* * * * *